US012692598B2

(12) United States Patent     (10) Patent No.:   US 12,692,598 B2

Dickey     (45) Date of Patent:     Jul. 28, 2026

(54) METHODS AND SYSTEMS FOR IMPROVED DEPOSITION PRODUCTS

(71) Applicant: LOTUS APPLIED TECHNOLOGY, LLC, Hillsboro, OR (US)

(72) Inventor: Eric Dickey, Beaverton, OR (US)

(73) Assignee: LOTUS APPLIED TECHNOLOGY, LLC, Hillsboro, OR (US)

( * ) Notice: Subject to any disclaimer, the term of this patent is extended or adjusted under 35 U.S.C. 154(b) by 0 days.

(21) Appl. No.: 18/544,205

(22) Filed: Dec. 18, 2023

(65) Prior Publication Data

US 2025/0197997 A1     Jun. 19, 2025

(51) Int. Cl.
| | |
|---|---|
| *C23C 16/455* | (2006.01) |
| *C23C 16/44* | (2006.01) |
| *C23C 16/458* | (2006.01) |
| *C23C 16/46* | (2006.01) |

(52) U.S. Cl.
CPC ...... *C23C 16/4554* (2013.01); *C23C 16/4408* (2013.01); *C23C 16/45551* (2013.01); *C23C 16/45563* (2013.01); *C23C 16/4582* (2013.01); *C23C 16/463* (2013.01)

(58) Field of Classification Search
None
See application file for complete search history.

(56) References Cited

U.S. PATENT DOCUMENTS

| | | | |
|---|---|---|---|
| 5,705,224 | A | 1/1998 | Murota et al. |
| 8,187,679 | B2 | 5/2012 | Dickey et al. |
| 2007/0281105 | A1 | 12/2007 | Mokhlesi et al. |
| 2013/0344688 | A1 | 12/2013 | Ye |
| 2018/0127877 | A1 | 5/2018 | Shim et al. |

OTHER PUBLICATIONS

Lim, et al, "Atomic Layer Deposition of Transition Metals", Department of Chemistry and Chemical Biology, Harvard University, Nature Publishing Group , vol. 2, Nov. 2003, www.nature.com/naturematerials, 6 pages.

*Primary Examiner* — Shamim Ahmed
*Assistant Examiner* — Bradford M Gates
(74) *Attorney, Agent, or Firm* — Miller Nash LLP

(57) ABSTRACT

This disclosure relates to methods and systems for selective atomic layer deposition. Cycle-by-cycle post-processing of the thin film occurs during growth of the thin film, instead of conducting post-processing after completion of the thin film. Thin films with improved properties result.

20 Claims, 4 Drawing Sheets

METHODS AND SYSTEMS FOR IMPROVED DEPOSITION PRODUCTS

TECHNICAL FIELD

This disclosure relates generally to manufacturing processes and in particular to methods and systems for improved deposition products.

BACKGROUND

An overview of conventional ALD processes is provided in Atomic Layer Epitaxy (T. Suntola and M. Simpson, eds., Blackie and Son Ltd., Glasgow, 1990), which is incorporated herein by reference. Numerous patents and publications describe atomic layer deposition (ALD) and sequential chemical vapor deposition (CVD). Atomic Layer Deposition (ALD) and chemical vapor deposition (CVD) can utilize the same precursors. However, in contrast to CVD, ALD involves a sequential exposure of a surface to the precursors. Additional steps, including purge steps, can occur in between precursor exposures, reducing the reaction byproducts trapped in the thin film of product produced by the chemical reactions.

Additionally, ALD provides conformal films, even in high-aspect ratio features. ALD reactions tend to coat any surface sequentially exposed to the precursors, including the walls of the reaction chamber and any other equipment present in the reaction chamber.

A need exists for deposition methods and systems that provide formation of thin films with improved properties.

BRIEF DESCRIPTION OF THE DRAWINGS

The embodiments disclosed herein will become more fully apparent from the following description and appended claims, taken in conjunction with the accompanying drawings. The drawings depict primarily generalized embodiments (and are not necessarily to scale), which embodiments will be described with additional specificity and detail in connection with the drawings in which:

DETAILED DESCRIPTION

Figure 1:
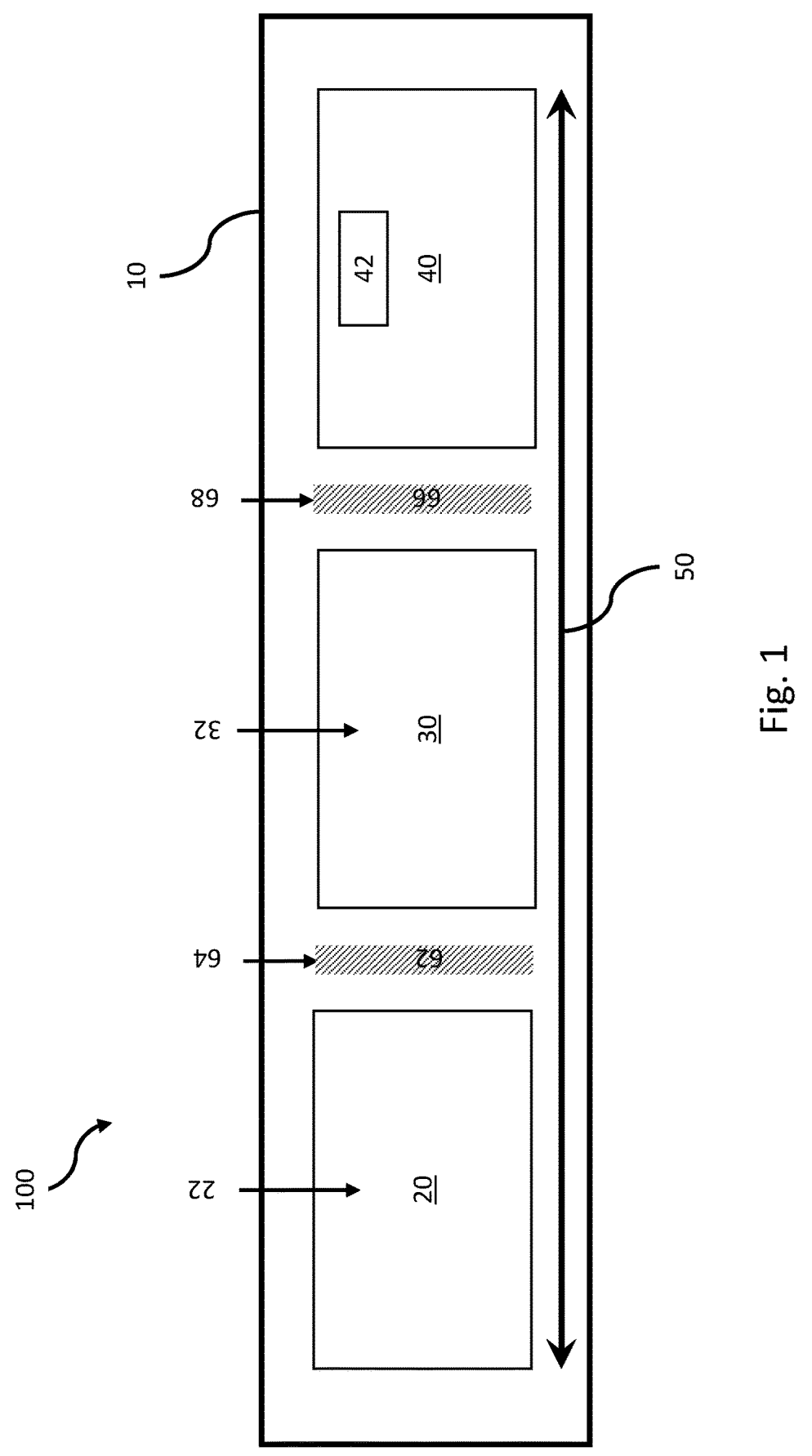
FIG. 1 illustrates a block diagram of one embodiment of an exemplary deposition system according to the methods and systems disclosed herein.

Disclosed herein are methods and systems for depositing thin films, where thermal processing of deposition products occurs cycle-by-cycle during deposition, instead of after formation of a complete deposition product in a post-processing step. For example, utilizing the methods and systems disclosed herein, materials (e.g., oxides and nitrides) can be grown with increased crystallinity and metals can be deposited with less shrinkage, as compared to materials formed with multiple deposition cycles, followed by a post-processing step. Beneficially, even thermally sensitive substrates can be coated using the methods and systems disclosed herein. Other advantages and benefits of the embodiments disclosed herein will become apparent as the embodiments are discussed in detail below.

In one embodiment, methods of depositing a thin film include providing a substrate to be coated and then repeatedly performing a cycle comprising a) exposing the substrate to a first precursor resulting in some of the first precursor adsorbing on the substrate as an adsorbed first precursor; b) exposing the substrate to a second precursor, resulting in some of the second precursor reacting with the adsorbed first precursor to form an intermediate product; and c) scanning the substrate with a localized energy to convert the intermediate product to a final product, resulting in at least some of the intermediate product converting to the final product with a growth-rate less than or equal to about one molecular layer of the final product. After multiple cycles a thin film of the final product is formed on the substrate. The final product may be an element (such as a metal), a compound (such as an oxide, nitride, etc.), or combinations thereof.

The final product may have more crystallinity, higher density, different stress, or combinations of the foregoing, as compared to the intermediate product. Additionally or alternatively, the final product may have a different chemical composition or stoichiometry from the intermediate product.

The methods disclosed herein may include purging unabsorbed first precursor from proximal the substrate prior to exposing the substrate to the second precursor. Likewise, L the methods disclosed herein may also include purging unreacted second precursor from proximal the substrate prior to scanning the substrate with the localized energy. The methods may also include cooling the substrate after scanning the substrate with the localized energy.

Scanning the selected region with the localized energy preferably temporarily heats the substrate and the intermediate product, thereby thermally treating the intermediate product and converting it to the final product. Scanning the selected region with the localized energy may also cause photolytic decomposition of at least some of the intermediate product and enables conversion of the intermediate product to the final product. In some embodiments, the localized energy source is selected to both heat the substrate and photolytically decompose the intermediate product.

The localized energy is preferably visible, ultraviolet, or infrared radiation from a light source, such as a halogen rapid thermal processing lamp but may also be a laser beam, an aggressive plasma, or a gentle plasma. As used herein, an "aggressive" plasma refers to a plasma capable of densifying a thin film, modifying the stress, and/or modifying the crystallinity of the intermediate product. Aggressive plasmas are contrasted with "gentle" plasmas, such as used for completing an ALD reaction sequence. Aggressive plasmas can be formed by high voltage, high current density, and/or the use of substrate bias to increase kinetic energy in the plasma. Gentle plasmas, on the other hand, can be formed with relatively low voltage and/or have relatively low kinetic energy where the plasma interacts with the substrate. An aggressive plasma may be used to modify the density, stress, and/or crystallinity of the final product, relative to the intermediate product. A gentle plasma may be used to change the chemical composition of the final product, relative to the intermediate product. For example, a gentle hydrogen-containing plasma may be used to convert a metal oxide or metal nitride intermediate product to a metal final product. The localized energy gentle plasma may be used to add a third half-reaction to the ALD sequence that is different from the second precursor exposure step. Thus, by using a gentle plasma as the localized energy, the processes and systems disclosed herein may be used to perform three-step ALD reactions: first precursor exposure, second precursor exposure (which may be a gentle plasma), and gentle plasma exposure with a precursor different from the second precursor.

The first precursor may include a first precursor gas.

The second precursor may include a hydrogen source, an oxygen source, a nitrogen source, a boron source, a carbon source, or combinations thereof. The intermediate product may include an oxide, nitride, boride, carbide, or combinations thereof. Exposing the substrate to the second precursor may involve exposing the substrate to a gentle plasma of the second precursor, whereby a plasma-enabled atomic layer deposition (PE-ALD) reaction occurs between the first precursor and the second precursor. Alternatively, the methods include heating one or both of the first precursor and the second precursor during formation of the intermediate product, whereby a thermal atomic layer deposition (ALD) reaction occurs.

The thin film of the final product may be formed on a portion of the substrate or an entire surface of the substrate.

The localized energy may be selected for absorption by the substrate while not being substantially absorbed by any precursor gas molecules present (such as a laser wavelength that is primarily absorbed by the substrate and/or intermediate product film but is not substantially absorbed by gas phase precursor gas molecules). This results in heating the substrate contacted with the localized energy without substantial gas-phase reaction of any precursor gas present.

The methods may further include actively cooling the backside of the substrate. In some embodiments, the methods may be performed in a cold-wall reactor chamber.

The methods may further include directing the first and second precursors away from the substrate prior to scanning the substrate with the localized energy. Directing the first and second precursors away from the substrate comprises evacuating the first and second precursors from the substrate.

Alternatively or additionally, directing the first and second precursors away from the substrate comprises displacing the first and second precursors proximal the substrate with a secondary gas. Non-limiting examples of the secondary gas include a background gas, a reagent gas, or mixtures thereof. "Background gas," as used herein, means under the process conditions present, the gas is substantially non-reactive with the respective precursor gas. Likewise, "reagent gas," as used herein, means under process conditions present, the gas is reactive with the adsorbed first precursor, adsorbed second precursor, and/or intermediate product.

Displacing the first and second precursors proximal the substrate with the secondary gas may involve introducing the secondary gas adjacent the localized energy and at a sufficient pressure and flow rate to form a gas curtain surrounding a pathway of the localized energy, thereby limiting interaction of gas-phase precursor gas(es) with the localized energy. A physical shroud may be used to direct the flow of the secondary gas around the localized energy, aiding formation of the gas shroud.

Directing the first and/or second precursor gas(es) away from the substrate and scanning the substrate with the localized energy may occur simultaneously or substantially simultaneously. For example, directing the precursor gas away from the substrate may be initiated prior to scanning the substrate with the localized energy and continue while scanning the substrate with the localized energy.

The geometry of the substrate is not limited. The substrate may be a curved surface, a flat surface, or a roll-to-roll film.

Repeatedly exposing the substrate to first and second precursors and scanning the substrate with the localized energy may include moving the substrate, moving the localized energy source, or both. For example, alternately positioning the localized energy source over the substrate may involve moving the localized energy source in a x-y plane above the substrate, such as in a path parallel to the substrate.

In certain embodiments, it will be beneficial to move the substrate relative to the localized energy source, rather than moving the localized energy source. Repeatedly moving the substrate may include repeatedly transporting the substrate through different zones within one or more reaction chambers, such as repeatedly transporting the substrate through a first precursor zone, a second precursor zone, and a localized energy zone.

Scanning the substrate with the localized energy may involve emitting pulsed localized energy or emitting continuous localized energy.

Turning now to systems for depositing thin films on substrates, FIG. 1 illustrates a block diagram of one embodiment of an exemplary system 100. The system includes a reaction chamber 10, having a first precursor zone 20 into which a first precursor 22 is introduced when the system 100 is in use, resulting in some of the first precursor 22 adsorbing on a substrate as an adsorbed first precursor, when the substrate is present. The reaction chamber 10 includes a second precursor zone 30 into which a second precursor 32, different from the first precursor 22, is introduced when the system is in use, resulting in some of the second precursor 32 reacting with the adsorbed first precursor to form an intermediate product, when the substrate is present. The reaction chamber 10 includes an energy zone 40 including a localized energy source 42 configured to direct a localized energy towards a substrate, when the system is in use, resulting in at least some of the intermediate product converting to a final product with a growth-rate less than or equal to about one molecular layer of the final product, when the substrate is present. A transport system 50 (illustrated as the back-and-forth arrow) is configured to repeatedly move the substrate from the first precursor zone 20, to the second precursor zone 30, and to the energy zone 40.

The system 100 includes a first isolation zone 62 interposed between the first precursor zone 20 and the second precursor zone 30, into which a secondary gas 64 is introduced when the system 100 is in use, resulting in limited mixing of unadsorbed first precursor 22 and unadsorbed second precursor 32.

The system 100 includes a second isolation zone 66 interposed between the second precursor zone 30 and the energy zone 40, into which a secondary gas 68 is introduced when the system is in use, resulting in limited presence of the second precursor 32 in the energy zone 40.

The isolation zone 62, the isolation zone 66, or both may not be present. Instead or in addition to the isolation zones, one or more dividers (not illustrated) may separate the different zones in the reaction chamber 10 to limit the flow of precursors between the zones.

The localized energy source 42 may be used to scan (or "write") a variety of patterns or may be used to scan an entire substrate.

The reaction chamber 10 may be a cold-wall reaction chamber. Reaction between the precursor gas 20, the precursor gas 30, and interior surfaces of the reaction chamber 10 may be minimal.

In FIG. 1, the localized energy source 42 is located within the reaction chamber 10; however, the localized energy source 42 could also be located elsewhere, including outside the reaction chamber 10, and the energy transmitted through a window towards the substrate.

The system 100 could include a control system operably connected to the localized energy source 42. The control system may be configured to control the localized energy source 42. The localized energy source 42 can emit energy in pulses or continuously.

The precursor 22 and the precursor 32 can be supplied in a single pulse or bolus by pumps (not shown). Alternatively, the precursor can be continuously pumped by pumps into the reaction chamber 10.

Any atomic layer deposition (ALD) process may be utilized with the system 100, although spatial atomic layer deposition processes are preferred, since the substrate would be transported to the energy zone 40 after each ALD cycle. In the system 100, a first ALD half-reaction may be performed in the first precursor zone 20 and a second ALD half-reaction performed in the second precursor zone 30. Each ALD half-reaction could be a thermal ALD half-reaction. Alternatively, in one of the precursor zones, such as the second precursor zone 30, a plasma-enable ALD half-reaction could be performed. The deposition processes that could be performed in the precursor zones is not limited.

An overview of conventional ALD processes is provided in Atomic Layer Epitaxy (T. Suntola and M. Simpson, eds., Blackie and Son Ltd., Glasgow, 1990), which is incorporated herein by reference. The conventional ALD processes disclosed therein can be modified to include cycle-by-cycle rapid thermal processing. U.S. Pat. No. 8,187,679, titled "Radical-Enhanced Atomic Layer Deposition System and Method," incorporated herein by reference, described systems and methods for ALD in which oscillating, reciprocating, or circular movement of a substrate can be employed to accomplish ALD processes using precursor radicals that are continuously introduced into a reaction space by a steady-state radical source. The gaseous radical species is maintained in a radicals zone within the reaction chamber while a precursor gas is introduced into a precursor zone. The precursor zone is spaced apart from the radicals zone to define a radical deactivation zone therebetween. The precursor zone and radicals zone of U.S. Pat. No. 8,187,679 can serve as the first and second precursor zones in the methods and systems disclosed herein, Including in the system 100.

The system 100 is only one embodiment of linear thin film deposition contemplated by this disclosure. Numerous variations to the linear process may be made without departing from the underlying concept of cycle-by-cycle post-processing of ALD grown films.

Figure 2:
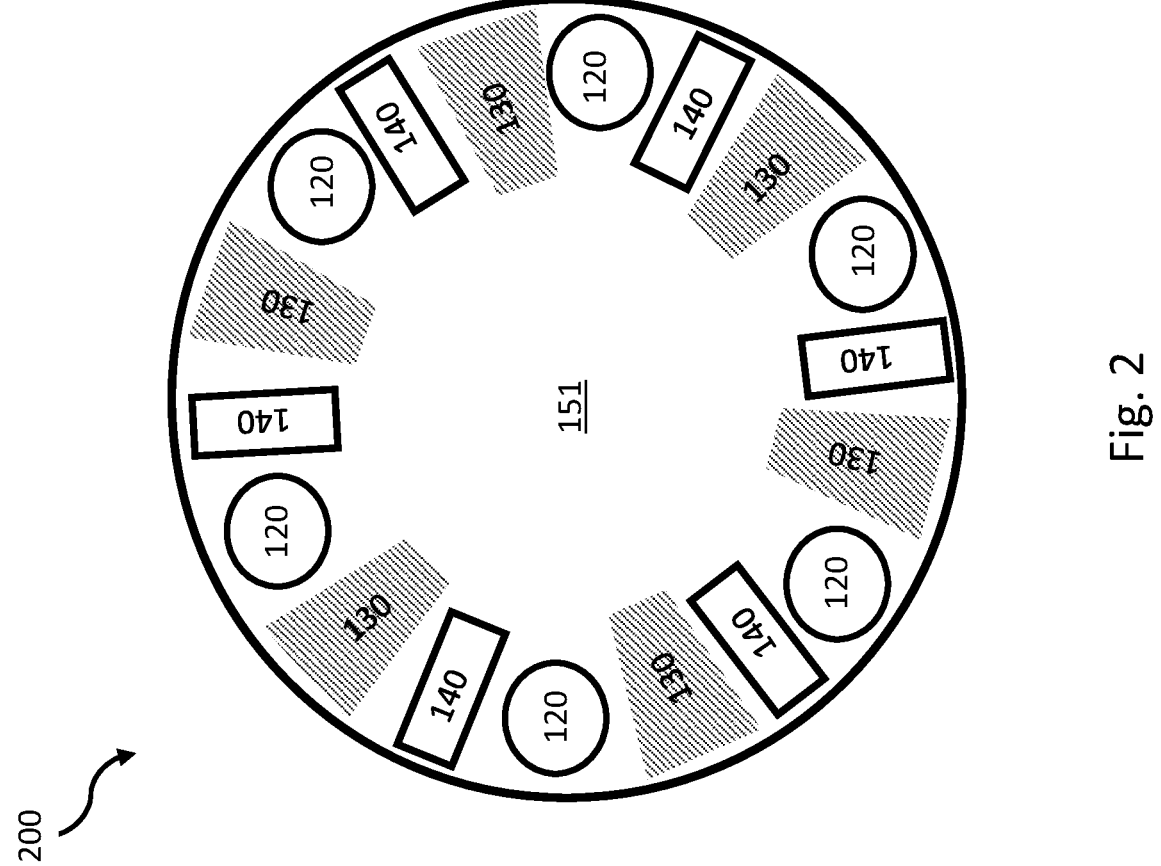
FIG. 2 illustrates an exemplary rotary deposition system according to the methods and systems disclosed herein.

FIG. 2 illustrates an exemplary rotary system 200. The system 200 includes a disc-shaped platen or carrier 151 that rotates about a central axis and is the positioning system. Substrates (not shown), such as disc-shaped silicon wafers, can be mounted on the surface of the platen 151. Substrates of other types and shapes may also be utilized. The platen 151 spins about its axis within a reaction chamber (not shown). The substrates are transported along a circular transport path sequentially passing through the first precursor zones 120, the second precursor zones 130, and the energy zones 140. Each of the energy zones 140 includes a localized energy source (not shown). When the localized energy source includes a heat lamp (such as an 8-inch halogen heat lamp), then the localized energy source scans the entire substrate as it passes underneath the heat lamp. When the localized energy source comprises a laser, then the localized energy source may "write" a pattern on the substrate as the substrate is scanned. In addition to a disc-shaped platen, a cylindrical platen may be used. Substrates could be rotated through different zones located around the perimeter of the cylinder.

Figure 3:
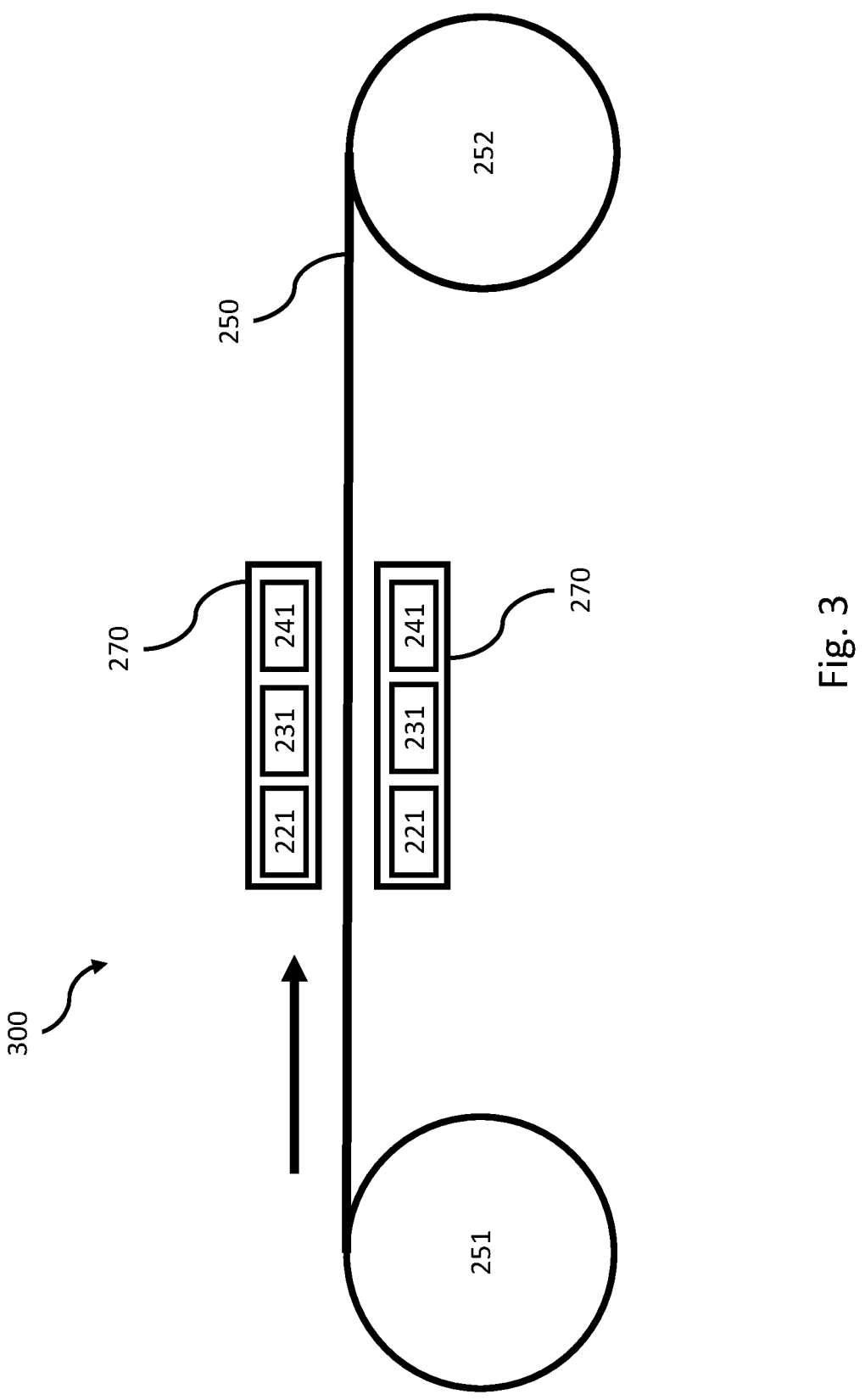
FIG. 3 illustrates an exemplary roll-to-roll deposition system according to the methods and systems disclosed herein.

FIG. 3 illustrates an exemplary roll-to-roll system 300. The substrate 250 is a thin film rolled from the unwind roll 2511 to the wind-up roll 252. In this embodiment, the unwind roll 251 and the wind-up roll 252 function as part of the transport system. In the illustrated embodiment, two printheads 270 are located on either side of the substrate 250. In the illustrated embodiment, the printheads 270 are stationary; however, the printheads 270 could also shuttle back-and-forth over the substrate 250 while the substrate 250 moves. For example, a positioning system (not shown) may be configured to repeatedly move the printhead relative to the substrate.

The printheads 270 each contain a first precursor nozzle 221 through which a first precursor is introduced when the system is in use, resulting in some of the first precursor adsorbing on a substrate as an adsorbed first precursor, when the substrate is present. The printheads 270 also each contain a second precursor nozzle 231 through which a second precursor, different from the first precursor, is introduced when the system is in use, resulting in some of the second precursor reacting with the adsorbed first precursor to form an intermediate product, when the substrate is present. Each of the printheads 270 further include a localized energy source 241 configured to direct a localized energy towards a substrate, when the system is in use, resulting in at least some of the intermediate product converting to a final product with a growth-rate less than or equal to about one molecular layer of the final product, when the substrate is present. The localized energy source 241 is preferably a rapid thermal processing (RTP) lamp, but may be a laser as well.

The printhead 270 may include a first isolation gas nozzle (not shown) through which a secondary gas is introduced when the system is in use, resulting in limited mixing of unadsorbed first precursor and unadsorbed second precursor.

The printhead 270 may further include a second isolation gas nozzle (not shown) through which a secondary gas is introduced when the system is in use, resulting in limited mixing of unadsorbed second precursor and the localized energy.

The printhead 270 may be located within a cold-wall reaction chamber.

The printhead 270 may further include multiple first precursor nozzles 221, multiple second precursor nozzles 231, and multiple localized energy sources 241.

The system 300 may include a control system operably connected to the localized energy source 241 and configured to pulse the localized energy.

Figure 4:
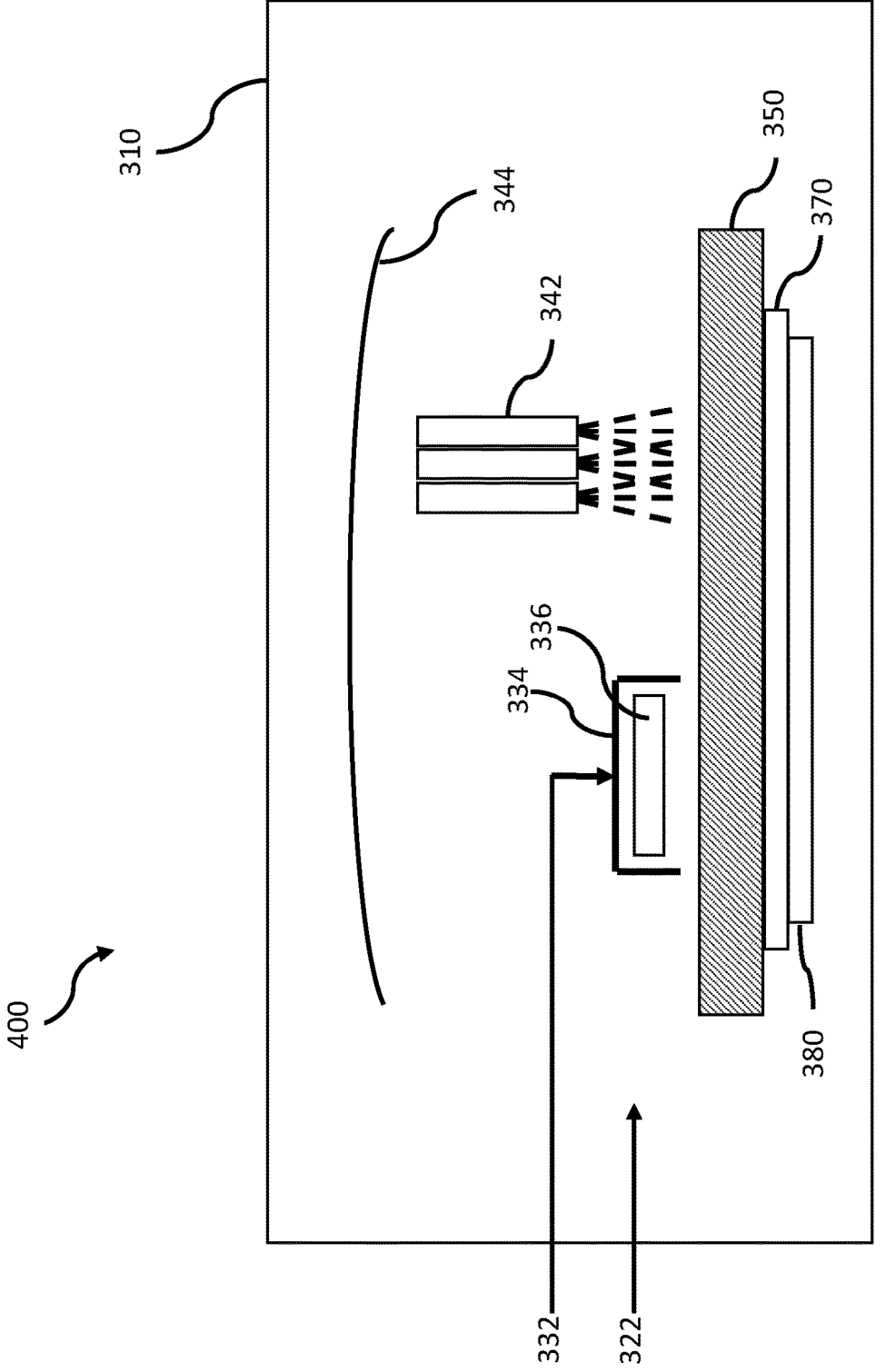
FIG. 4 illustrates a cross-section of an exemplary deposition system according to the methods and systems disclosed herein.

FIG. 4 illustrates a cross-sectional view of one embodiment of an exemplary system 400. System 400 is similar to the system 100; however, the different zones are consolidated. The system includes a reaction chamber 310, including a nozzle (not shown) for introducing a precursor gas 322 into the reaction chamber 310. The entire substrate 350 is exposed to the precursor gas 322. A second precursor gas 332 is introduced into the reaction chamber 310 at the electrode 334. The first precursor gas 322 and the second precursor gas 332 are selected to be substantially non-reactive with each other unless the second precursor gas 332 is activated by the electrode 334 to form a gaseous radical species (i.e., plasma 336). The gaseous radical species is preferably unstable and readily recombines or otherwise deactivates as it exits the electrode 334. This minimizes reaction of the gaseous radical species with the first precursor gas 322 other than with adsorbed first precursor gas 322. Therefore, even though the first precursor gas 322 is widely dispersed and a monolayer of the precursor gas 322 may adsorb to the entire substrate and chamber surfaces, only a thin film of the reaction product forms in regions of the substrate where the electrode is present.

The electrode 334 and the localized energy source 342 are mobile relative to the substrate 350—either via movement of the substrate 350, movement of the electrode 334 and/or the localized energy source 342, or combinations thereof (control systems and actuators not shown). Accordingly, intermediate product and final product can be formed on the entire substrate, selected portions of the substrate, or even built up more on certain portions of the substrate.

A mirror 344 aids reflecting light back towards the substrate 350.

Cooling system 370 cools the backside of the substrate 350.

A transport system 380 is configured to repeatedly move the substrate 350 relative to the electrode 334 and the localized energy source 342. In the system, thereby exposing different regions.

The system 400 may include a secondary gas nozzle (not shown) for introducing a secondary gas adjacent the localized energy source.

One of skill in the art will understand that many features of the various exemplary systems disclosed herein can be combined or interchanged. For example, any of the systems disclosed herein may include cooling systems for cooling the backside of a substrate when the substrate is in the energy zone. Likewise, any of the systems disclosed herein may be modified for scanning both sides of a substrate. In any of the systems, the first and second precursor zones can be collapsed into a single precursor zone with a broadly available first precursor gas and a mobile plasma head for delivering the second precursor gas as a plasma.

Additionally, lasers may be used instead of rapid thermal processing (RTP) lamps as the localized energy sources. The pattern "written" or scanned by the lasers may be finer than the pattern scanned by RTP lamps. Lasers could be beneficial when a high-resolution pattern on a substrate is desired. For example, a thin film intermediate product could be grown on an entire substrate; however, cycle-by-cycle only a specific pattern of the intermediate product may be converted into the final product with high resolution. A subsequent etch process could be used to selectively remove the intermediate product and leave only the high resolution final product, or vice versa.

In certain embodiments, the systems disclosed herein may be integrated with other processes without damaging the other processing system. For example, for processes using plasma-enabled ALD and/or cold-wall reactors, then the growth of intermediate or final products on surfaces other than the substrate may be limited. For such processes, the systems could be integrated with other systems. Therefore, printheads and other processing equipment can be in the same reaction chamber as the ALD equipment. For example, a printhead within the reaction chamber could provide additional processing of the substrate before, after, or during generation of the thin film product. This could potentially reduce both equipment costs and reduce floor space needed for manufacturing semiconductors and other devices.

Any atomic layer deposition (ALD) process may be utilized with the concepts disclosed herein, although spatial atomic layer deposition processes are preferred, since the substrate is exposed to the energy zone after each ALD cycle.

The phrase "operably connected to" or "operably coupled to" refers to any form of interaction between two or more entities, including mechanical, electrical, magnetic, electromagnetic, fluid, and thermal interaction. Two entities may interact with each other even though they are not in direct contact with each other. For example, two entities may interact with each other through an intermediate entity.

Without further elaboration, it is believed that one skilled in the art can use the preceding description to utilize the present disclosure to its fullest extent. The examples and embodiments disclosed herein are to be construed as merely illustrative and exemplary and not a limitation of the scope of the present disclosure in any way. It will be apparent to those having skill in the art, and having the benefit of this disclosure, that changes may be made to the details of the above-described embodiments without departing from the underlying principles of the disclosure herein.

The invention claimed is:

1. A method of forming a thin patterned material, the method comprising:
   providing a substrate to be coated; and
   repeatedly performing a cycle comprising:
      exposing the substrate to a first precursor, resulting in some of the first precursor adsorbing on the substrate as an adsorbed first precursor;
      exposing the substrate to a second precursor, resulting in some of the second precursor reacting with the adsorbed first precursor to form an intermediate product on the surface; and
   scanning the substrate with a localized energy that is applied to the intermediate product in a specific pattern to convert a patterned portion of the intermediate product to a final product in the specific pattern, resulting in the patterned portion of the intermediate product converting to the final product with a growth-rate less than or equal to about one molecular layer of the final product per cycle,
   whereby after multiple cycles a thin pattern of the final product is formed on the substrate in the specific pattern.

2. The method of claim 1, wherein the final product has more crystallinity, higher density, different stress, or combinations of the foregoing, as compared to the intermediate product; wherein the final product has a different chemical composition or stoichiometry from the intermediate product; or both.

3. The method of claim 1, further comprising purging unabsorbed first precursor from proximal the substrate prior to exposing the substrate to the second precursor; further comprising purging unreacted second precursor from proximal the substrate prior to scanning the substrate with the localized energy; or both.

4. The method of claim 1, further comprising cooling the substrate after scanning the substrate with the localized energy.

5. The method of claim 1, wherein the localized energy comprises: radiation from an infrared, visible, or ultraviolet light source; a plasma; or combinations thereof.

6. The method of claim 1, wherein the second precursor comprises a hydrogen source, an oxygen source, a nitrogen source, a boron source, a carbon source, or combinations thereof, and wherein the intermediate product comprises an oxide, nitride, boride, carbide, or combinations thereof.

7. The method of claim 1, wherein exposing the substrate to the second precursor comprises exposing the substrate to a plasma of the second precursor, whereby a plasma-enabled atomic layer deposition (PE-ALD) reaction occurs between the first precursor and the second precursor.

8. The method of claim 7, wherein the intermediate product comprises a metal oxide or metal nitride and wherein the localized energy comprises a hydrogen-containing plasma, whereby the metal oxide or metal nitride is converted to a metal by the localized energy, whereby after multiple PE-ALD reactions and localized energy cycles a thin film of a metal final product is formed on the substrate.

9. The method of claim 8, wherein the hydrogen-containing plasma has a lower kinetic energy than the plasma of the second precursor that results in the PE-ALD reaction.

10. The method of claim 1, further comprising heating one or both of the first precursor and the second precursor during formation of the intermediate product, whereby a thermal atomic layer deposition (ALD) reaction occurs.

11. The method of claim 1, further comprising directing the first and second precursors away from the substrate prior to scanning the substrate with the localized energy.

12. The method of claim 1, wherein the final product comprises an element, a compound, or combinations thereof.

13. The method of claim 1, wherein the step of scanning the substrate with the localized energy includes directing a laser beam toward the substrate.

14. The method of claim 13, wherein the laser beam is non-continuously applied to the substrate.

15. The method of claim 14, wherein the laser beam is pulsed.

16. The method of claim 13, wherein the laser beam writes the specific pattern onto the substrate during each cycle to form the thin pattern of the final product.

17. The method of claim 13, wherein the laser beam or the substrate, or both, are moved relative to the other during the scanning of the substrate with the localized energy.

18. The method of claim 13, wherein the laser beam is emitted at a wavelength that is primarily absorbed by the substrate and/or the intermediate product, but not substantially absorbed by the first precursor or the second precursor in their gaseous phase.

19. The method of claim 1, wherein the scanning of the substrate with the localized energy in the specific pattern is performed by a printhead that emits the localized energy non-continuously while the printhead is shuttled back and forth over the substrate.

20. The method of claim 1, further comprising selectively etching the intermediate product that has not been converted to the final product, while leaving the thin pattern of the final product on the substrate.

* * * * *